(12) United States Patent
Alisafaee et al.

(10) Patent No.: US 9,360,590 B2
(45) Date of Patent: Jun. 7, 2016

(54) METAMATERIAL-BASED OPTICAL DISPERSION COMPENSATION

(71) Applicants: Hossein Alisafaee, Charlotte, NC (US); Michael Fiddy, Huntersville, NC (US)

(72) Inventors: Hossein Alisafaee, Charlotte, NC (US); Michael Fiddy, Huntersville, NC (US)

(73) Assignee: The University of North Carolina at Charlotte, Charlotte, NC (US)

( * ) Notice: Subject to any disclaimer, the term of this patent is extended or adjusted under 35 U.S.C. 154(b) by 0 days.

(21) Appl. No.: 14/650,989

(22) PCT Filed: Dec. 12, 2013

(86) PCT No.: PCT/US2013/074530
§ 371 (c)(1),
(2) Date: Jun. 10, 2015

(87) PCT Pub. No.: WO2014/093567
PCT Pub. Date: Jun. 19, 2014

(65) Prior Publication Data
US 2015/0331146 A1    Nov. 19, 2015

Related U.S. Application Data

(60) Provisional application No. 61/736,178, filed on Dec. 12, 2012.

(51) Int. Cl.
| | |
|---|---|
| *H01S 3/00* | (2006.01) |
| *G02B 1/00* | (2006.01) |
| *G02B 27/30* | (2006.01) |
| *H01S 5/026* | (2006.01) |
| *H01S 5/50* | (2006.01) |
| *H04B 10/2513* | (2013.01) |

(52) U.S. Cl.
CPC .............. *G02B 1/007* (2013.01); *G02B 27/30* (2013.01); *H01S 5/026* (2013.01); *H01S 5/50* (2013.01); *H04B 10/25133* (2013.01)

(58) Field of Classification Search
CPC ....................................................... G02B 1/007
USPC ....................................................... 359/337.5
See application file for complete search history.

(56) References Cited

U.S. PATENT DOCUMENTS

| | | | |
|---|---|---|---|
| 7,586,670 B2* | 9/2009 | Chowdhury | .......... G02F 1/3534 359/326 |
| 2001/0053165 A1 | 12/2001 | Wang et al. | |
| 2011/0069377 A1 | 3/2011 | Wu et al. | |
| 2011/0171374 A1 | 7/2011 | Smolyaninov et al. | |
| 2011/0292394 A1 | 12/2011 | Wu et al. | |

OTHER PUBLICATIONS

Mar. 10, 2014 International Search Report issued in International Application No. PCT/US13/74530.

* cited by examiner

*Primary Examiner* — Mark Hellner
(74) *Attorney, Agent, or Firm* — Clements Bernard PLLC; Christopher L. Bernard; Lawrence A. Baratta, Jr.

(57) ABSTRACT

A metamaterial-based dispersion compensator includes a plurality of layers arranged in a geometric structure; wherein the plurality of layers comprise engineered metamaterials; wherein the engineered metamaterials and the geometric structure are configured to compensate dispersion across a wavelength spectrum. The metamaterial-based dispersion compensator utilizes a specifically engineered frequency response, in a compact metamaterial form-factor, to correct for naturally occurring and problematic dispersion in physical systems such as in optical communication systems.

15 Claims, 8 Drawing Sheets

KRAMERS-KRONIG

WAVELENGTH (nm)

METAMATERIAL-BASED OPTICAL DISPERSION COMPENSATION

CROSS-REFERENCE TO RELATED APPLICATIONS

The present application is a U.S. National Stage Entry under 35 U.S.C. 371 of PCT Application No. PCT/US13/74530, filed Dec. 12, 2013, and entitled "METAMATERIAL-BASED OPTICAL DISPERSION COMPENSATION," which claims priority to U.S. Provisional Patent Application No. 61/736,178, filed Dec. 12, 2012, and entitled "METAMATERIAL-BASED OPTICAL DISPERSION COMPENSATION," the contents of which are incorporated by reference herein.

STATEMENT REGARDING FEDERALLY SPONSORED RESEARCH OR DEVELOPMENT

This invention was made with Government support under award number 1068050 by the National Science Foundation (NSF). The Government has certain rights in the invention.

FIELD OF THE DISCLOSURE

The present disclosure relates generally to metamaterials. More particularly, the present disclosure relates to optical systems and metamaterial-based dispersion compensators (MMDC).

BACKGROUND OF THE DISCLOSURE

Dispersion is a well-known constraint in optical communication systems. In particular, dispersion is problematic at bit rates in excess of 10 Gb/s in fiber optic systems and requires compensation for proper system operation. Various conventional dispersion compensation techniques include fiber Bragg gratings (FBG), dispersion compensating fibers (DCF), and electronic dispersion compensation (EDC). The vast majority of conventional systems deployed rely on DCF in dispersion compensation modules (DCMs). DCF includes a spool of fiber with an inverse dispersion profile to counteract, i.e. compensate, dispersion over a specific length of a type of fiber. For example, a DCM can be configured to compensate 80 km worth of Single Mode Fiber (SMF) or Non-Dispersion Shifted Fiber (NDSF). Other types of DCMs may be available for other fiber types and/or other distances. Disadvantageously, conventional DCMs are bulk components, are costly, and have high insertion loss. It is difficult to cost reduce conventional DCMs as they are a physical spool of fiber with attendant manufacturing costs. The trend has been moving towards EDC which is electronic adaptive processing to compensate dispersion in the electrical domain opposed to the optical domain. While EDC overcomes the aforementioned limitations of DCMs, it introduces significant complexity in systems with adaptive algorithms that must be continually maintained and implemented in circuitry. That is, EDC is continuously operated whereas DCMs are bulk devices that have no operating parameters for ongoing adjustment. What would be advantageous is a dispersion compensating device that operated similar to DCMs without the aforementioned limitations.

BRIEF SUMMARY OF THE DISCLOSURE

In various exemplary embodiments, metamaterial-based dispersion compensators are disclosed which can be used in optical communication systems, for example. The metamaterial-based dispersion compensators utilize a specifically engineered frequency response, in a compact metamaterial form-factor, to correct for naturally occurring and problematic dispersion in physical systems. One example is the dispersion that occurs in fiber optic networks, in which pulse detection, shaping and reemission is routinely required, at great expense and complexity, in order to maintain very high bit rates. Passive, compact customized metamaterial devices are discussed herein for inclusion into such systems to replace the expensive electronics (EDC) and/or dispersion compensating fiber (DCF). The metamaterial-based dispersion compensators use meta-atoms in a device for compensating dispersion at telecommunication wavelengths (e.g., C-band).

In an exemplary embodiment, a metamaterial-based optical dispersion compensator includes a plurality of layers arranged in a geometric structure; wherein the plurality of layers include engineered structures; and wherein the engineered metamaterials and the geometric structure are configured to compensate dispersion across a wavelength spectrum. The plurality of layers can include a first (possibly structured) metal layer, a second dielectric layer, and a third (possibly structured) metal layer. The first metal layer and the third metal layer can include one of gold (Au) or silver (Ag) or any material capable of supporting an electronic or displacement current; and the second dielectric layer can include one of magnesium fluoride ($MgF_2$) or silicon dioxide ($SiO_2$) or some appropriate and convenient dielectric. The second dielectric layer can be configured to tune a capacitance of the engineered metamaterials to alter dispersion compensation across the wavelength spectrum. The second dielectric layer can include materials for a semiconductor optical amplifier. The wavelength spectrum can include about 1530 to 1560 nm. A length of the plurality of layers can be about 150 nm. The plurality of layers can be one of deposited on, attached to, or disposed to a core of an optical fiber. The plurality of layers can be included in a photonic integrated circuit. The geometric structure can include a fishnet structure. The fishnet structure can include rows intersecting columns each of which can be equally spaced therebetween. The engineered metamaterials can be abstracted as an LC circuit with capacitance tuned to provide a requisite profile of dispersion compensation.

In another exemplary embodiment, a system includes a first structured metal layer, a second dielectric layer, and a third structured metal layer each formed in a geometric fishnet structure; wherein the first metal layer, the second dielectric layer, and the third metal layer include engineered metamaterials configured to compensate dispersion across a wavelength spectrum; and wherein the engineered metamaterials are abstracted as an LC circuit with capacitance tuned to provide a requisite profile of dispersion compensation.

In yet another exemplary embodiment, a method includes depositing a first metal layer in a geometric fishnet structure; depositing a second dielectric layer on the first metal layer in the geometric fishnet structure; depositing a third metal layer on the second dielectric layer in the geometric fishnet structure; and utilizing the first metal layer, the second dielectric layer, and the third metal layer to compensate dispersion on one or more optical wavelengths. The method can further include performing the depositing steps on a core of an optical fiber.

BRIEF DESCRIPTION OF THE DRAWINGS

The present disclosure is illustrated and described herein with reference to the various drawings, in which like reference numbers are used to denote like system components/method steps, as appropriate, and in which.

DETAILED DESCRIPTION OF THE DISCLOSURE

Again, in various exemplary embodiments, metamaterial-based dispersion compensators are disclosed which can be used in optical communication systems, for example. The metamaterial-based dispersion compensators utilize a specifically engineered frequency response, in a compact metamaterial form-factor, to correct for naturally occurring and problematic dispersion in physical systems. One example is the dispersion that occurs in fiber optic networks, in which pulse detection, shaping and reemission is routinely required, at great expense and complexity, in order to maintain very high bit rates. Passive, compact customized metamaterial devices are discussed herein for inclusion into such systems to replace the expensive electronics (EDC) and/or dispersion compensating fiber (DCF). The metamaterial-based dispersion compensators use meta-atoms in a device for compensating dispersion at telecommunication wavelengths (e.g., C-band).

Figure 1:
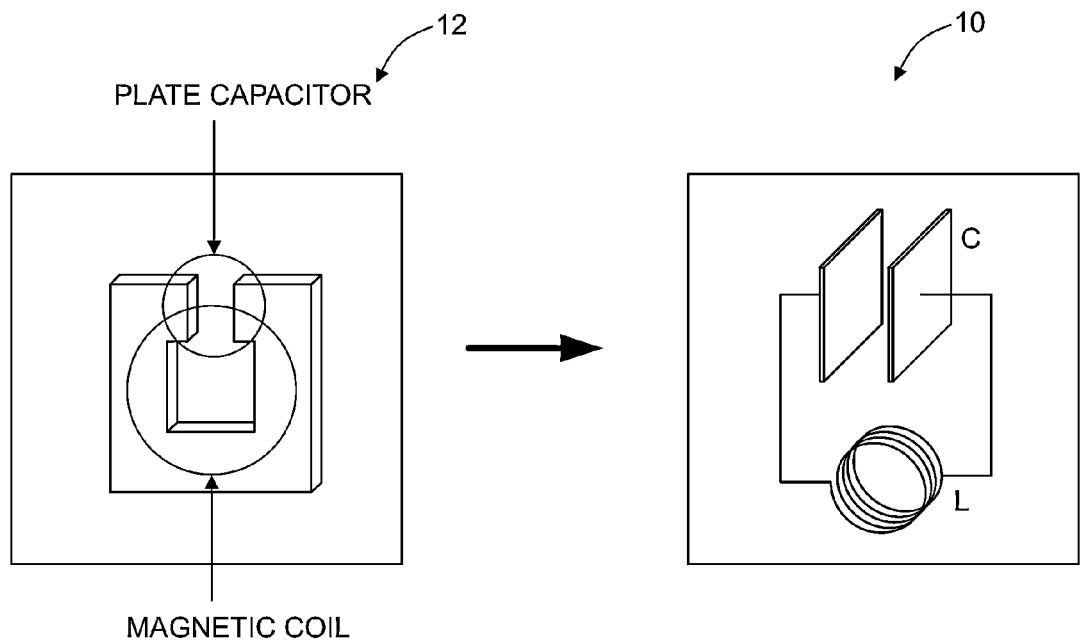
FIG. 1 is an example of an LCR circuit equivalent to a meta-atom structure known as a split ring resonator (in a single cell)

Referring to FIG. 1, in an exemplary embodiment, an example of an LCR circuit 10 equivalent to a meta-atom structure 12 known as a split ring resonator (in a single cell) is illustrated. Metamaterials make use of meta-atoms which are material shapes representing abstracted LCR resonant circuits. The tuning of these circuits and their complexity (i.e. equivalent circuit representations) provide a design tool for developing specific dn/dω functional forms. The resonance frequency of the meta-atom structure 12 can be found from capacitance and inductance of the equivalent LCR circuit 10. The frequency response of meta-atom can also be obtained with this method. For example, the split ring resonator has a resonance at:

$$\omega = 1/\sqrt{LC}$$
$$C = \epsilon_0 \frac{A_C}{d}$$
$$L = \mu_0 \frac{l^2}{t}$$
$$\omega \propto c/\text{size}$$

The meta-atom structure 12 may be fabricated with a physical size that ensures it is considerably smaller than the smallest wavelength of interest in the system for which dispersion compensation is required, e.g. λ/10. This could range from meter to nm scales depending on the application of interest. For example, in fiber optic-related applications, the meta-atom structure 12 can be extremely small such as 1550 nm/10 or about 155 nm.

Figure 2A:
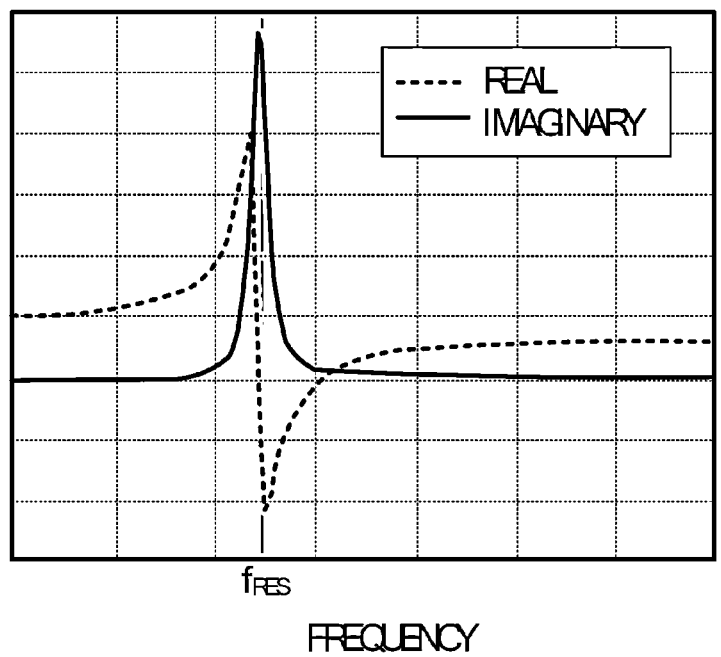
FIG. 2A is a graph of typical spectra for real part and imaginary part of refractive index/permittivity.
Figure 2B:
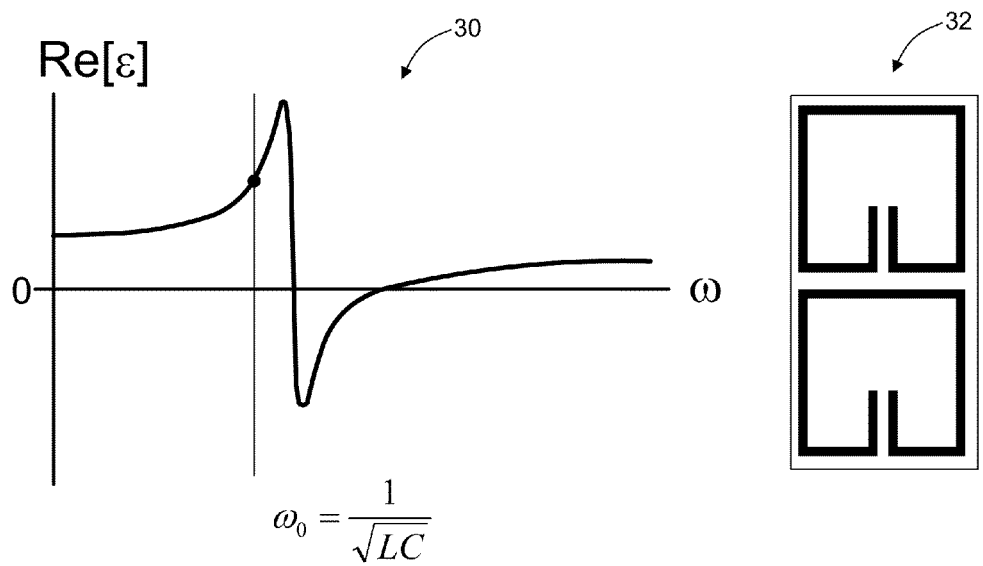
FIG. 2B is a graph of the real part of permittivity (Re[ϵ])
Figure 2B:
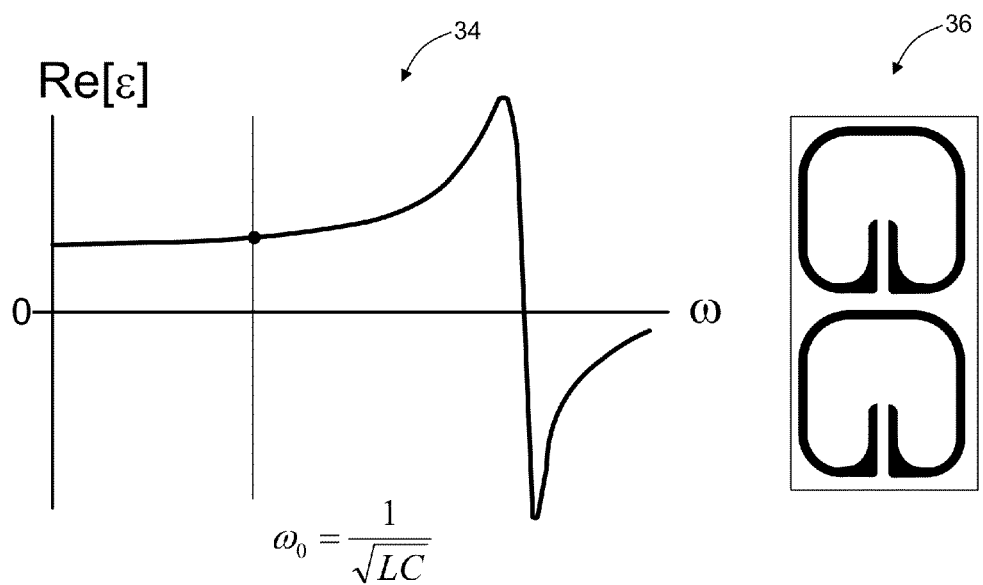
Figure 2C:
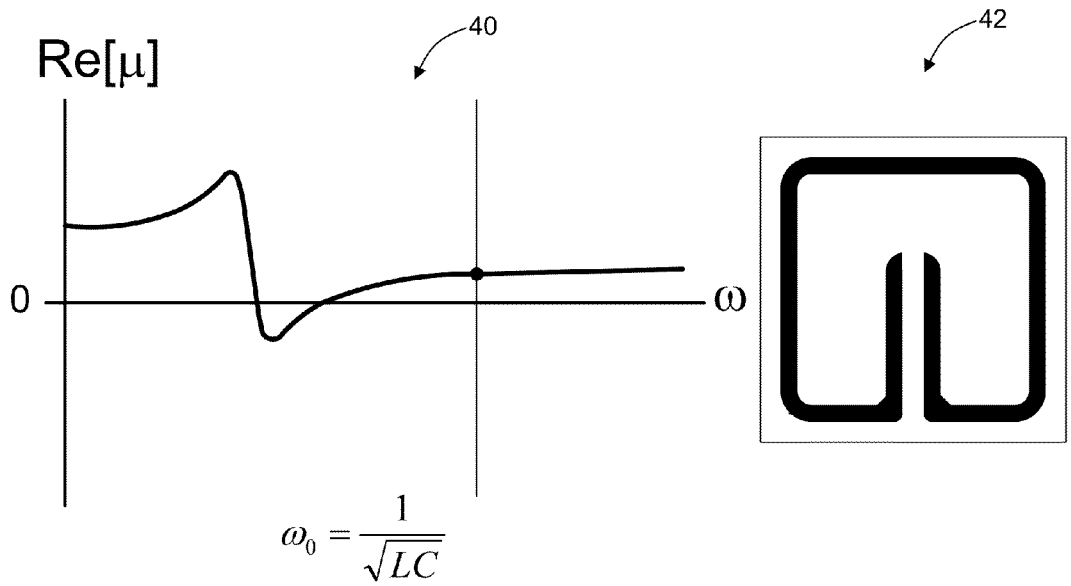
FIG. 2C is a graph of the real part of permeability (Re[μ])
Figure 2C:
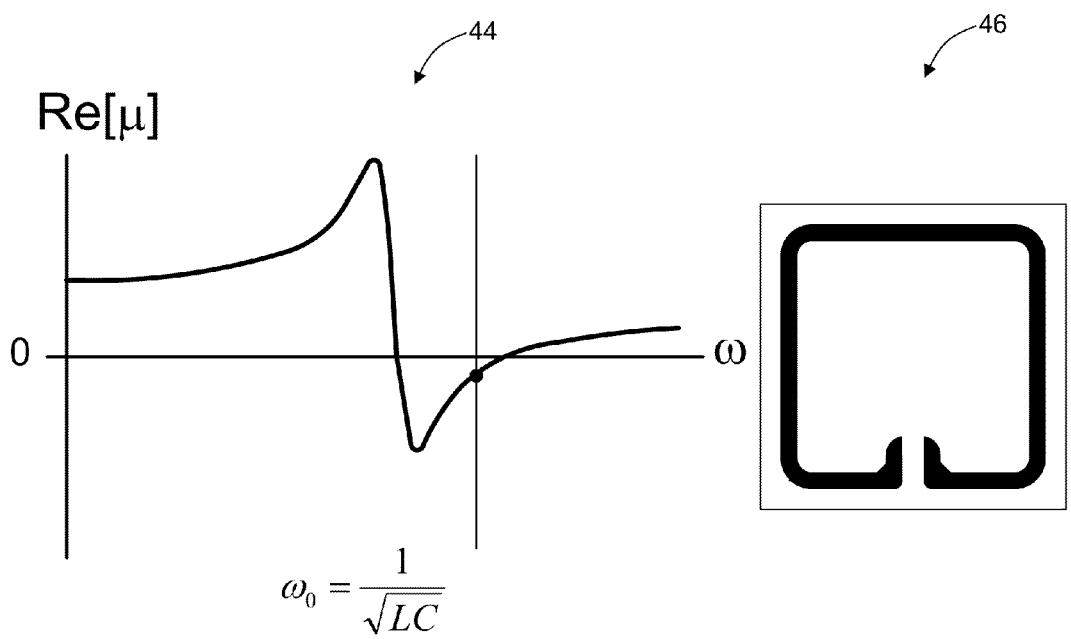
Figure 2D:
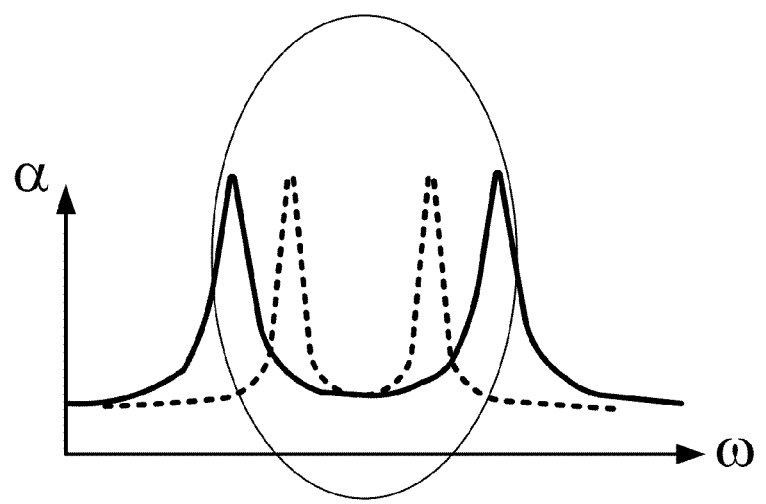
FIG. 2D is a graph illustrating use of Kramers-Kronig relations in FIG. 2A.
Figure 2D:
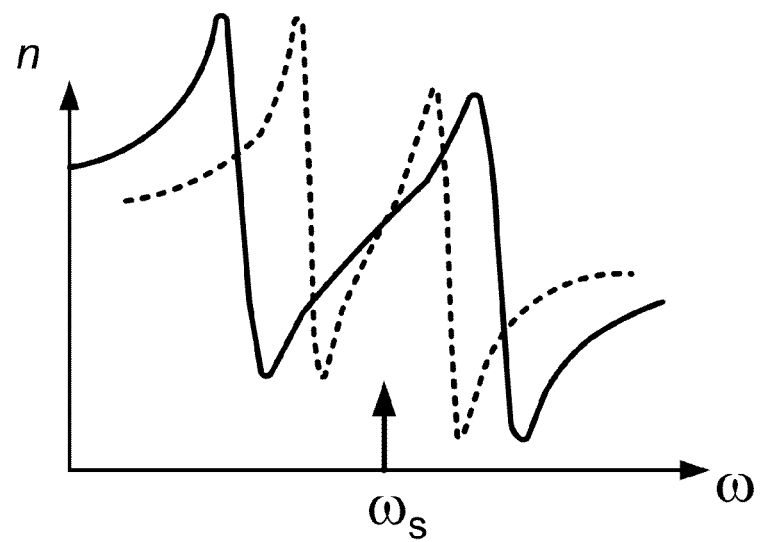

Referring to FIGS. 2A-2D, in an exemplary embodiment, graphs illustrate typical spectra for real part and imaginary part of refractive index/permittivity (FIG. 2A), the real part of permittivity (Re[ϵ]) (FIG. 2B), the real part of permeability (Re[μ]) (FIG. 2C), and use of Kramers-Kronig relations in FIG. 2A (FIG. 2D). At the resonance frequency, the peak of imaginary part is at maximum, and real part behaves as described. There is a Hilbert transform between real part and imaginary part. With respect to FIGS. 2B-2C, it is noted with metamaterials and engineering associated therewith, it is possible to tune the electric and magnetic resonance based on the construction of the equivalent LCR circuit 10 and the meta-atom structure 12. This tuning of the resonance can change the properties of the meta-atom structure 12 leading to a negative refractive index at some frequencies. Of note, the refractive index, $n=\sqrt{\epsilon\mu}=\sqrt{(-\epsilon)(-\mu)}=\pm\sqrt{\epsilon\mu}$ thereby leading to negative refractive index at some frequencies.

Specifically, FIGS. 2B-2C each show a first and second graph of Re[ϵ] and Re[μ], respectively. Next to each of the graphs is an associated split ring design. In FIG. 2B for the real part of permittivity (Re[ϵ]), a first graph 30 is associated with a first split ring design 32 whereas a second graph 34 is associated with a second split ring design 36. In FIG. 2C for the real part of permeability (Re[μ]), a first graph 40 is associated with a first split ring design 42 whereas a second graph 44 is associated with a second split ring design 46. These different graphs 30, 34, 40, 44 illustrates how changes in the split ring shape allow the Re[ϵ] or Re[μ] function to be tuned, i.e. tuning of the resonance based on the geometrical parameters.

In FIG. 2D, the Kramers-Kronig relations can be applied to FIG. 2A. The Kramers-Kronig relations are bidirectional mathematical relations, connecting the real and imaginary parts of any complex function that is analytic in the upper half-plane. These relations are often used to calculate the real part from the imaginary part (or vice versa) of response functions in physical systems because for stable systems causality implies the analyticity condition is satisfied, and conversely, analyticity implies causality of the corresponding stable physical system. These relations can be express as:

$$\chi'(\omega) = -\frac{1}{\pi}\int_{-\infty}^{\infty}\frac{\chi''(\omega')}{\omega-\omega'}d\omega'$$
$$\chi''(\omega) = \frac{1}{\pi}\int_{-\infty}^{\infty}\frac{\chi'(\omega')}{\omega-\omega'}d\omega'$$

From this, a relationship can be determined including the specific dn/dω functional forms as follows:

$$S = \frac{c}{v_g} = \frac{n+\omega\frac{\partial n}{\partial \omega}}{1-\frac{\omega}{c}\frac{\partial n}{\partial k}}$$

In various exemplary embodiments, the metamaterial-based dispersion compensators include metamaterials and the use of dispersion relations to shape dispersion as a function of coupling between elements in periodic arrays of sub-wavelength sized resonant structures.

Figure 3:
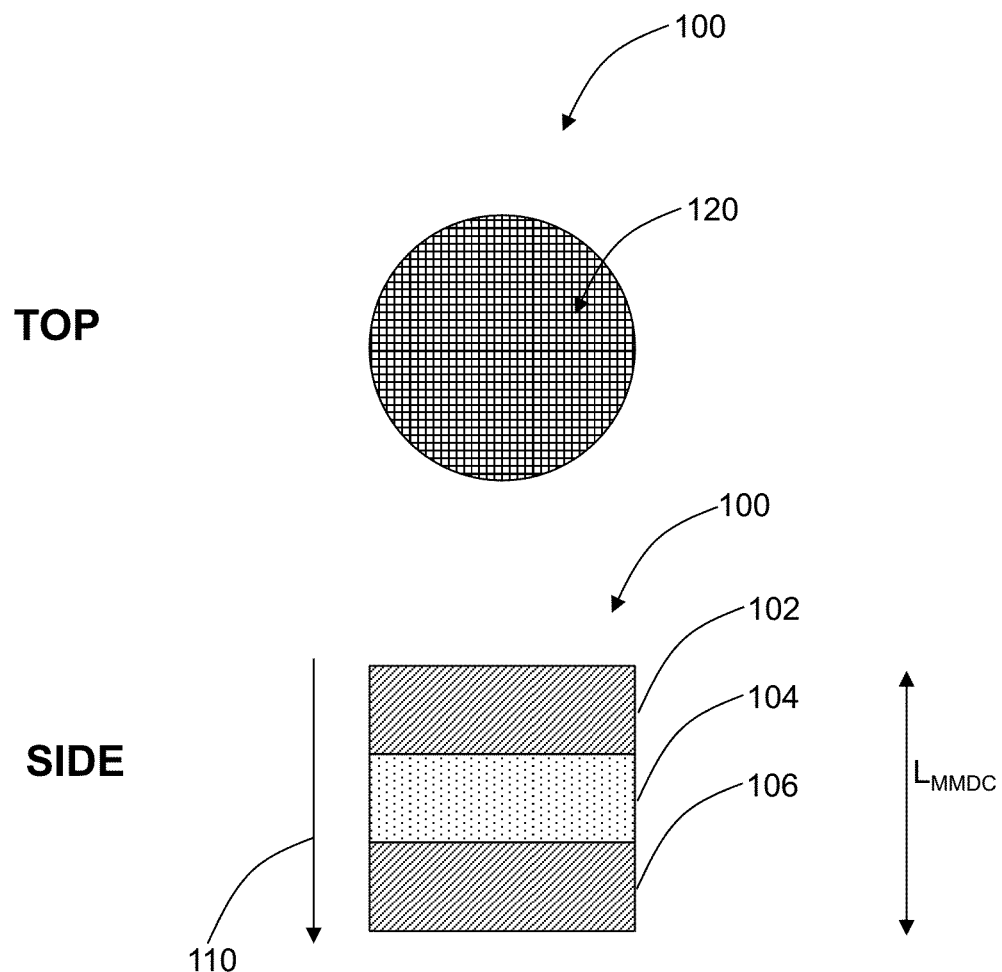
FIG. 3 is a metamaterial-based dispersion compensator illustrated in a top and side view.

Referring to FIG. 3, in an exemplary embodiment, a metamaterial-based dispersion compensator 100 is illustrated in a top and side view. In an exemplary embodiment, from the top view, the metamaterial-based dispersion compensator 100 can include a substantially circular shape such that the metamaterial-based dispersion compensator 100 can be placed or deposited on a core of an optical fiber. From the side view, the metamaterial-based dispersion compensator 100 can include multiple layers such as layers 102, 104, 106, and light can propagate through the metamaterial-based dispersion compensator 100 in a direction 110 (or in both the direction 110 and opposite the direction 110). The layers 102, 106 can be a same metal material such as, for example, silver (Ag) or gold (Au). The middle layer 104 can include, for example, magnesium fluoride ($MgF_2$) or silicon dioxide ($SiO_2$). Other materials are also contemplated. The middle layer 104 can include electro-optical components to tune the capacitance of the metamaterial-based dispersion compensator 100 for dispersion adjustments. Additionally, the middle layer 104 can be a semiconductor optical amplifier (SOA). Further, from the top view, the metamaterial-based dispersion compensator 100 can include a fishnet structure 120 for each of the layers 102, 104, 106.

In various exemplary embodiments, the design of the metamaterial-based dispersion compensator 100 may be such that figure of merit (FOM) of metamaterial layers 102, 104, 104 is as high as possible. Then, by stacking of the metamaterial layers 102, 104, 104, a desired amount of negative dispersion is achieved. Another important aspect of the metamaterial-based dispersion compensator 100 is to provide a dispersion curve that matches to compensate, as close as possible, for the dispersion produced in the waveguide, e.g. optical fiber, to guarantee effective compensation. The metamaterial-based dispersion compensator 100 has a length, $L_{MMDC}$, that is sub-wavelength sized. For example, the length, $L_{MMDC}$, can be much less than 1550 nm such as, around 150 nm. In this manner, the metamaterial-based dispersion compensator 100 can be deposited, attached, or disposed directly to optical fiber and/or incorporated in photonic integrated circuits (PICs). Alternatively, the metamaterial-based dispersion compensator 100 can be in a module that has fiber inputs and outputs. The metamaterial-based dispersion compensator 100 offers a single-pass compensation structure where wavelengths only need to travel through the length, $L_{MMDC}$, to achieve compensation. Further, the metamaterial-based dispersion compensator 100 can be passive, requiring no external power or adaptive control. The metamaterial-based dispersion compensator 100 can include engineered dispersion compensation between about 1530 to 1560 nm (or other wavelength ranges) based on dispersion profiles for differing distances (e.g., 20-100 km) over different fiber types (e.g., Non-Dispersion Shifted Fiber (NDSF), Non-Zero Dispersion Shifted Fiber (NZDSF), Dispersion Shifted Fiber (DSF), etc.).

In an exemplary embodiment, the metamaterial-based dispersion compensator 100 can include a plurality of different designs based on distances, e.g. 20 km, 40 km, 60 km, 80 km, etc. For example, a 40 km metamaterial-based dispersion compensator 100 can provide about −800 ps/nm of dispersion compensation. With each of the distance-specific metamaterial-based dispersion compensators 100, tuning can be performed for associated dispersion curves based on the fiber type (NZ-DSF and associated variants, DSF an associated variants, NDSF and associated variants, Dispersion Flattened Fiber (DFF), etc.). The tuning can also be performed based on specific channel performance, e.g. in one transmission line, because of many reasons (e.g. bends), it is possible that one or more of the channels are suffering from extra dispersion. Then, a tunable DCM is required to compensate for that specific channels(s). Here, the metamaterial-based dispersion compensators 100 can include control of dispersion characteristics by use of electro optic effects of the mid-dielectric layer, i.e. the middle layer 104. This is the mechanism to adjust/control dispersion. This could also be possible for tuning to match different fiber lengths, for example a 60 km instead of 40 km, however there may be some limitations in the distance tuning, e.g. 80 km instead of 40 km—tuning from −800 ps/nm to 2×(−800 ps/nm).

Figure 4:
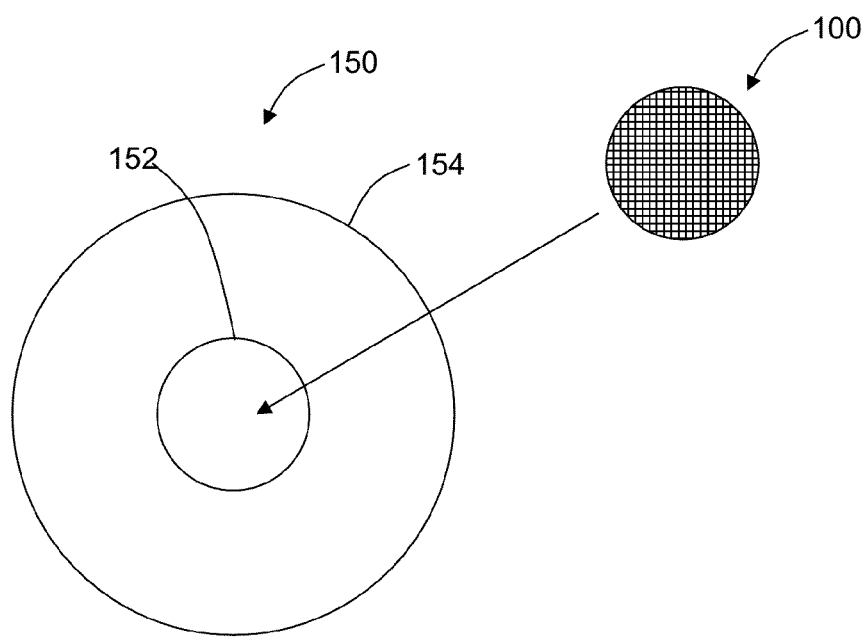
FIG. 4 is the metamaterial-based dispersion compensator of FIG. 3 illustrated with optical fiber in a front view.
Figure 5:
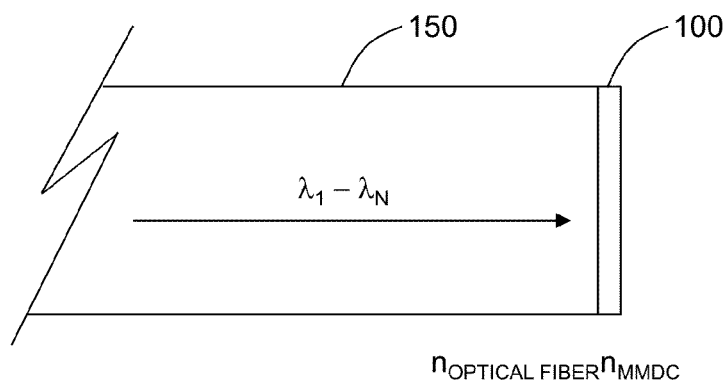
FIG. 5 is the metamaterial-based dispersion compensator of FIG. 3 illustrated with optical fiber in a side view.

Referring to FIGS. 4-5, in an exemplary embodiment, the metamaterial-based dispersion compensator 100 is illustrated with optical fiber 150 in a front view (FIG. 4) and a side view (FIG. 5). In FIG. 4, the optical fiber 150 includes a core 152 and a cladding 154. As known to those of ordinary skill in the art, optical wavelengths, $\lambda_1$-$\lambda_N$, propagate within the core 152. The metamaterial-based dispersion compensator 100 can be placed, deposited on, attached to, etc. the core 152 to provide compensation in various fiber optic scenarios including in-line dispersion compensation at amplifiers (e.g., every 60-80 km) or for pre-compensation at optical receivers. Due to the expected cost and small size, the metamaterial-based dispersion compensator 100 can be used in-line to provide bulk compensation across the range of optical wavelengths, $\lambda_1$-$\lambda_N$, as well as at receivers including PIC-based receivers for individual wavelengths. Other applications are also contemplated.

In FIG. 5, the optical wavelengths, $\lambda_1$-$\lambda_N$, are illustrated traversing the optical fiber 150 and reaching the metamaterial-based dispersion compensator 100. Again, in an exemplary embodiment, the N optical wavelengths, $\lambda_1$-$\lambda_N$, can be across the C-band (1530-1560 nm) and N can be a function of the spacing in the C-band, lower spacing in GHz, the higher N is. In other exemplary embodiments, operation is contemplated in other bands such as the L-band (1565-1610 nm) and the like. In an exemplary embodiment, the metamaterial-based dispersion compensator 100 is impedance matched to the optical fiber 150 such that the reflection loss is practically zero. This is a unique advantage of the metamaterial-based dispersion compensator 100 relative to conventional DCMs. The optical fiber 150 can include a refractive index of $n_{optical\ fiber}$ and the metamaterial-based dispersion compensator 100 can include about a same negative refractive index of $n_{MMDC}$ such that $n_{optical\ fiber}$=$n_{MMDC}$. Advantageously, the metamaterial-based dispersion compensator 100 can perform dispersion compensation without requiring collocated amplifiers to counteract any insertion loss. In another exemplary embodiment, where amplification is needed, the middle layer 104 can include a SOA or EDFA gain material or the like.

Figure 6:
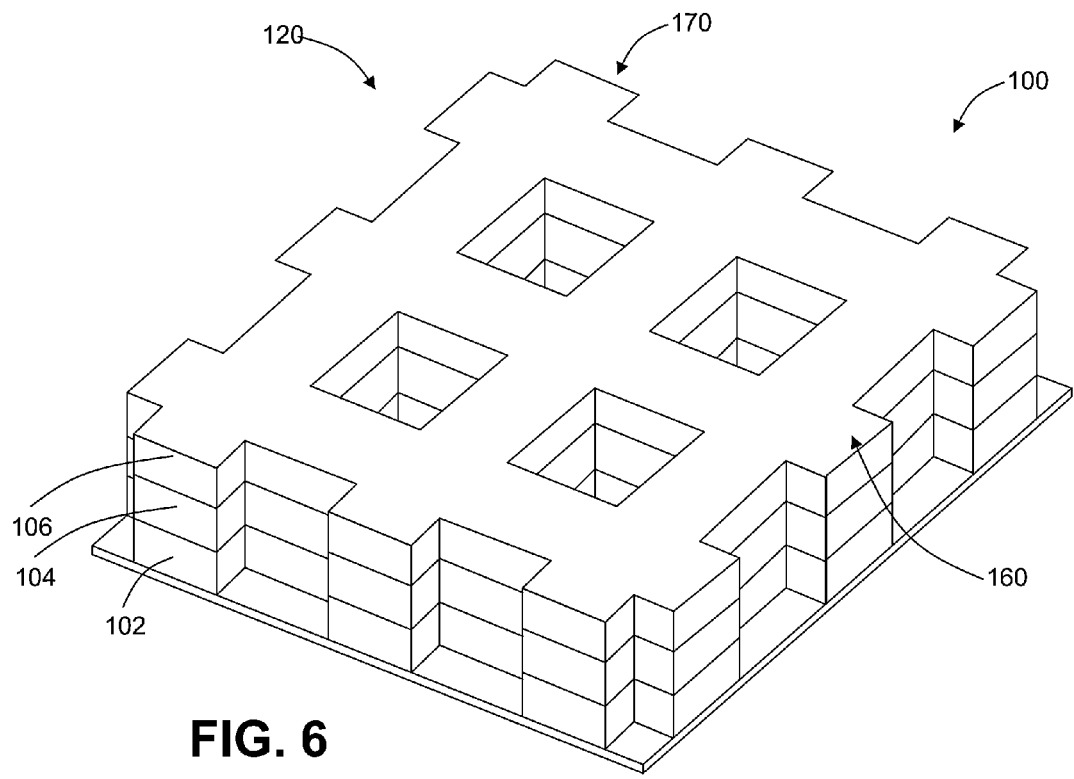
FIG. 6 is an exemplary fishnet structure for the metamaterial-based dispersion compensator of FIG. 3.
Figure 7:
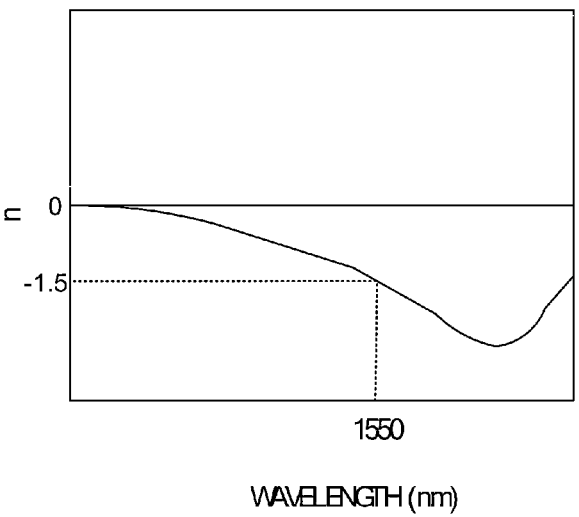
FIG. 7 is a graph of the associated refractive index spectrum of fishnet structure of FIG. 6.

Referring to FIGS. 6-7, in an exemplary embodiment, an exemplary fishnet structure 120 is illustrated for the metamaterial-based dispersion compensator 100 (FIG. 6) along with a graph of the associated refractive index spectrum of fishnet structure 120 (FIG. 7). As can be seen in FIG. 7, the fishnet structure 120 of the metamaterial-based dispersion compensator 100 includes about a same negative refractive index profile as the optical fiber 150's positive refractive index profile. FIG. 7 illustrates the spectra of real and imaginary parts of refracting index of the fishnet structure 120. In experiments, it has been understood that the dispersion compensation profile of the metamaterial-based dispersion compensator 100 is much more based on the geometry of the layers 102, 104, 106, i.e. the fishnet structure 120, and then the materials used for each of the layers 102, 104, 106. In experiments, the fishnet structure 120 has shown the best geometry for compensating dispersion in optical fibers.

The fishnet structure 120 is formed for each of the layers 102, 104, 106 and includes rows 160 and intersecting columns 170 each about equally spaced therebetween. In an exemplary embodiment, the columns 170 and the rows 160 can be formed in a substantially circular configuration as shown in FIG. 3. In another exemplary embodiment, the columns 170 and the rows 160 can be formed in a substantially square configuration with overlap of the core 152. Other embodiments are also contemplated.

Figure 8:
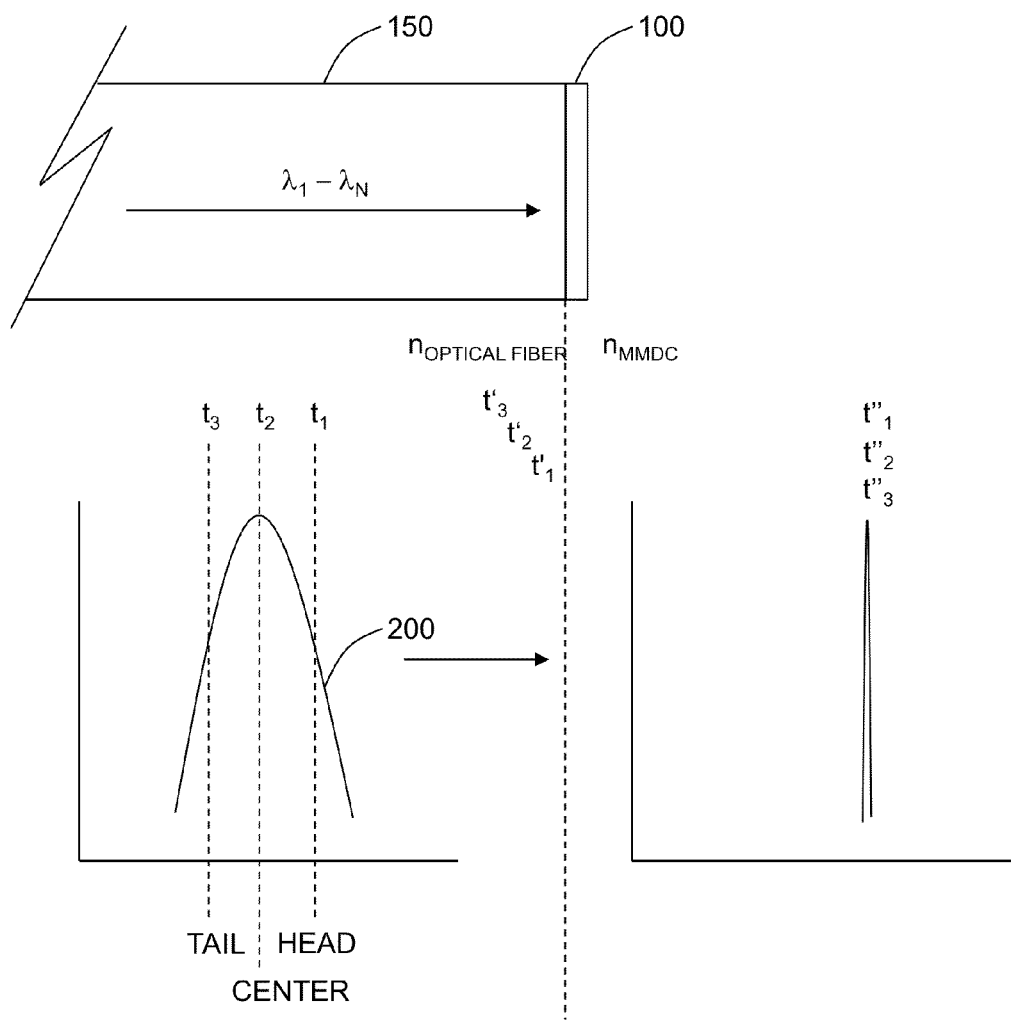
FIG. 8 is a graph illustrating functionally operation of the metamaterial-based dispersion compensator of FIG. 3.

Referring to FIG. 8, in an exemplary embodiment, a graph illustrates functionally operation of the metamaterial-based dispersion compensator 100. First, a pulse 200 is propagating in the optical fiber 150. For illustration purposes, the pulse 200 can be said to have a head at time $t_1$, a center at time $t_2$, and a tail at time $t_3$. Each will arrive at the metamaterial-based dispersion compensator 100 at time $t'_1$, time $t'_2$, and time $t'_3$ such that at time $t'_1 \approx$ time $t'_2 \approx$ time $t'_3$. The metamaterial in the metamaterial-based dispersion compensator 100 operates as nanoantenna elements that reradiate the portions of pulse 200 using a delayed phase such that the pulse 200 is reradiated at time $t''_1$, time $t''_2$, and time $t''_3$ such that at time $t''_1 \approx$ time $t''_2 \approx$ time $t''_3$ thereby providing a compressed pulse through the metamaterial-based dispersion compensator 100.

Of note, the metamaterial-based dispersion compensator 100 has been described herein for compensating dispersion, i.e. chromatic dispersion. However, the metamaterial-based dispersion compensator 100 can also be modified to compensate polarization-mode dispersion. This is possible since the 3D structure of the metamaterial allows the dispersion characteristics to also be adapted for each linearly polarized component by making it anisotropic. Then the linear birefringence of the metamaterial structure can be exploited to correct for two components of the polarization in the system, having two engineered dispersion curves.

Other exemplary applications besides dispersion compensation are also contemplated herein such as spectroscopy, pulsed lasers, pulse compression/decompression applications, lab-on-a-chip, etc.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. A metamaterial-based dispersion compensator, comprising:
   a plurality of layers arranged in a geometric structure;
   wherein the plurality of layers comprise engineered structures; and
   wherein the engineered structures and the geometric structure are configured to compensate dispersion across a wavelength spectrum by temporally correcting a wavefront.

2. The metamaterial-based dispersion compensator of claim 1, wherein the plurality of layers comprise a first metal layer, a second dielectric layer, and a third metal layer.

3. The metamaterial-based dispersion compensator of claim 2, wherein the first metal layer and the third metal layer comprise one of gold (Au) or silver (Ag);
   wherein the second dielectric layer comprises one of magnesium fluoride ($MgF_2$) or silicon dioxide ($SiO_2$).

4. The metamaterial-based dispersion compensator of claim 2, wherein the second dielectric layer is configured to tune a capacitance of the engineered structures to alter dispersion compensation across the wavelength spectrum.

5. The metamaterial-based dispersion compensator of claim 2, wherein the second dielectric layer comprises materials for a semiconductor optical amplifier.

6. The metamaterial-based dispersion compensator of claim 1, wherein the wavelength spectrum comprises about 1530 to 1560 nm.

7. The metamaterial-based dispersion compensator of claim 5, wherein a length of the plurality of layers is about 150 nm.

8. The metamaterial-based dispersion compensator of claim 1, wherein the plurality of layers are one of deposited on, attached to, or disposed to a core of an optical fiber.

9. The metamaterial-based dispersion compensator of claim 1, wherein the plurality of layers are included in a photonic integrated circuit.

10. The metamaterial-based dispersion compensator of claim 1, wherein the geometric structure comprises a fishnet structure.

11. The metamaterial-based dispersion compensator of claim 9, wherein the fishnet structure comprises rows intersecting columns each about equally spaced therebetween.

12. The metamaterial-based dispersion compensator of claim 1, wherein the engineered structures are abstracted as an LC circuit with capacitance tuned to provide a requisite profile of dispersion compensation.

13. A system, comprising:
   a structured first metal layer, a second dielectric layer, and a third structured metal layer each formed in a geometric fishnet structure;
   wherein the first metal layer, the second dielectric layer, and the third metal layer comprise engineered structures configured to compensate dispersion across a wavelength spectrum by temporally correcting a wavefront; and
   wherein the engineered structures are abstracted as an LC circuit with capacitance tuned to provide a requisite profile of dispersion compensation.

14. A method, comprising:
   depositing a first metal layer in a geometric fishnet structure;
   depositing a second dielectric layer on the first metal layer in the geometric fishnet structure;
   depositing a third metal layer on the second dielectric layer in the geometric fishnet structure; and
   utilizing the first metal layer, the second dielectric layer, and the third metal layer to compensate dispersion on one or more optical wavelengths by temporally correcting a wavefront.

15. The method of claim 14, further comprising:
   performing the depositing steps on a core of an optical fiber.

* * * * *